US011428479B2

(12) United States Patent
Gao

(10) Patent No.: US 11,428,479 B2
(45) Date of Patent: Aug. 30, 2022

(54) COMPACT THERMAL CONTROL PLATE

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

(*) Notice: Subject to any disclaimer, the term of this patent is extended or adjusted under 35 U.S.C. 154(b) by 283 days.

(21) Appl. No.: 16/849,655

(22) Filed: Apr. 15, 2020

(65) Prior Publication Data
US 2021/0325128 A1 Oct. 21, 2021

(51) Int. Cl.
F28F 3/12 (2006.01)
H05K 7/20 (2006.01)
F25B 29/00 (2006.01)
H05B 3/20 (2006.01)
F28F 23/02 (2006.01)
F28F 3/02 (2006.01)
F24H 1/12 (2022.01)
H01L 23/473 (2006.01)

(52) U.S. Cl.
CPC .............. F28F 3/12 (2013.01); F28F 23/02 (2013.01); H05B 3/20 (2013.01); F24H 1/121 (2013.01); F25B 29/00 (2013.01); F28F 3/02 (2013.01); H01L 23/4735 (2013.01); H05K 7/20 (2013.01)

(58) Field of Classification Search
CPC .... F28F 3/02; F28F 3/12; F24H 1/121; H05K 7/20; H01L 23/4735; H05B 3/20; F25B 29/00
See application file for complete search history.

(56) References Cited

U.S. PATENT DOCUMENTS

| 5,486,681 | A | * | 1/1996 | Dagnac | H05K 7/20 219/400 |
| 5,977,785 | A | * | 11/1999 | Burward-Hoy | G01R 31/2874 324/750.09 |
| 6,201,221 | B1 | * | 3/2001 | LaGrotta | H04B 1/036 219/483 |
| 8,151,872 | B2 | * | 4/2012 | Di Stefano | F28F 27/00 165/80.4 |
| 2005/0151553 | A1 | * | 7/2005 | Kabbani | G01R 31/2891 324/750.08 |
| 2011/0056927 | A1 | * | 3/2011 | Wu | H05B 3/50 219/540 |

* cited by examiner

Primary Examiner — Leonard R Leo
(74) Attorney, Agent, or Firm — Womble Bond Dickinson (US) LLP

(57) ABSTRACT

Embodiments are disclosed of a thermal control plate including a cooling layer and a heating layer. The cooling layer includes a thermally conductive base adapted to be thermally coupled to one or more heat-generating electronic components, cooling fins thermally coupled to the base, and a cooling cover plate coupled to the ends of the plurality of cooling fins. The thermally conductive base, the cooling cover plate, and the plurality of cooling fins form a plurality of cooling channels through which a working fluid can flow. The heating layer includes a heater, heating fins thermally coupled to the heater, and a heating cover plate coupled to the ends of the plurality of heating fins. The heater, the heating cover plate, and the heating fins form a plurality of heating channels through which the working fluid can flow. A fluid distribution can distribute the working fluid into the heating channels and cooling channels.

20 Claims, 7 Drawing Sheets

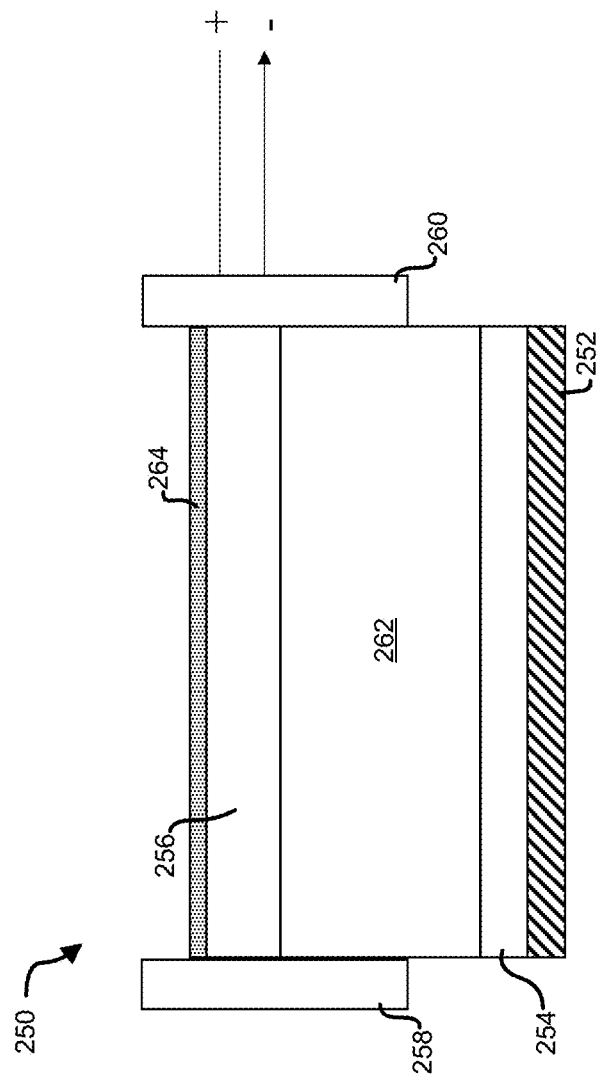

COMPACT THERMAL CONTROL PLATE

TECHNICAL FIELD

The disclosed embodiments relate generally to temperature control systems for electronic equipment and in particular, but not exclusively, to a compact thermal control plate package usable in a temperature control system.

BACKGROUND

Much modern electronic equipment operates in predictable and steady temperature conditions. In data centers, for instance, the ambient temperature is very tightly controlled so that all the servers, routers, edge computing servers, etc., within the data center operate in steady, known temperature conditions. In homes and workplaces the temperature is less tightly controlled but typically does not vary widely, so that even personal, home, and business electronics operate within a larger but still tolerable temperature range. In both these environments, the ambient temperature is such that electronic equipment usually needs only cooling, not heating.

But there are applications in which electronic equipment operates in uncontrolled temperature conditions where the temperature and humidity can vary widely. Electronics that operate outdoors are an example. Depending on the location and season, they can be forced to operate in ambient temperatures ranging from below freezing to very hot. Because electronics can have trouble starting up in very cold conditions and operating in very hot conditions, these applications can require both heating and cooling. Previous temperature control systems have typically provided heating or cooling, but not both. Some systems exist that use an electrical heater in a cooling loop, but these systems might not be applicable for some kinds of electronics and, moreover, these systems are not easy to control and have relatively low efficiency.

In addition to needing both heating and cooling, many electronics systems and hardware, such as those used in edge computing, have limited space, so that implementing a thermal solution that enables both cooling and heating functions can be a challenge. And even without space constraints, a thermal loop with multiple components including cooling devices and heating devices can significantly decrease reliability, especially when these products are used in an edge environment.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 2A-2B are conceptual drawings of the construction of embodiments of a temperature control plate for both heating and cooling.

DETAILED DESCRIPTION

Embodiments are described of a compact thermal control plate for use in a temperature control system. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments.

Embodiments are described of a compact thermal control plate design for electronics thermal management, including both cooling and heating, that provides a robust compact solution which uses less space, decreases the system complexity, and increases reliability. In addition, the solution can be cost effective with proper design and implementation. The thermal control plate is assembled with multiple layers, and the different structures and devices are packaged within the layers. The thermal control plate includes a cooling plate which is thermally coupled to heat-generating electronics components such as high power-density processors. Cooling fins are thermally coupled to the cooling plate. A heater uses a heat plate which has one or more power resistors packaged inside it and also has heating fins thermally coupled to it. An internal fluid delivery structure is used to distribute a working fluid evenly over the cooling fins and heater/heating fins for better heat transfer and fluid distribution. Fluid is supplied through an inlet of the thermal control plate and is delivered to the fluid channel within the thermal control plate and distributed to the heating and cooling fins before it leaves the thermal control plate through an outlet.

Figure 1A:
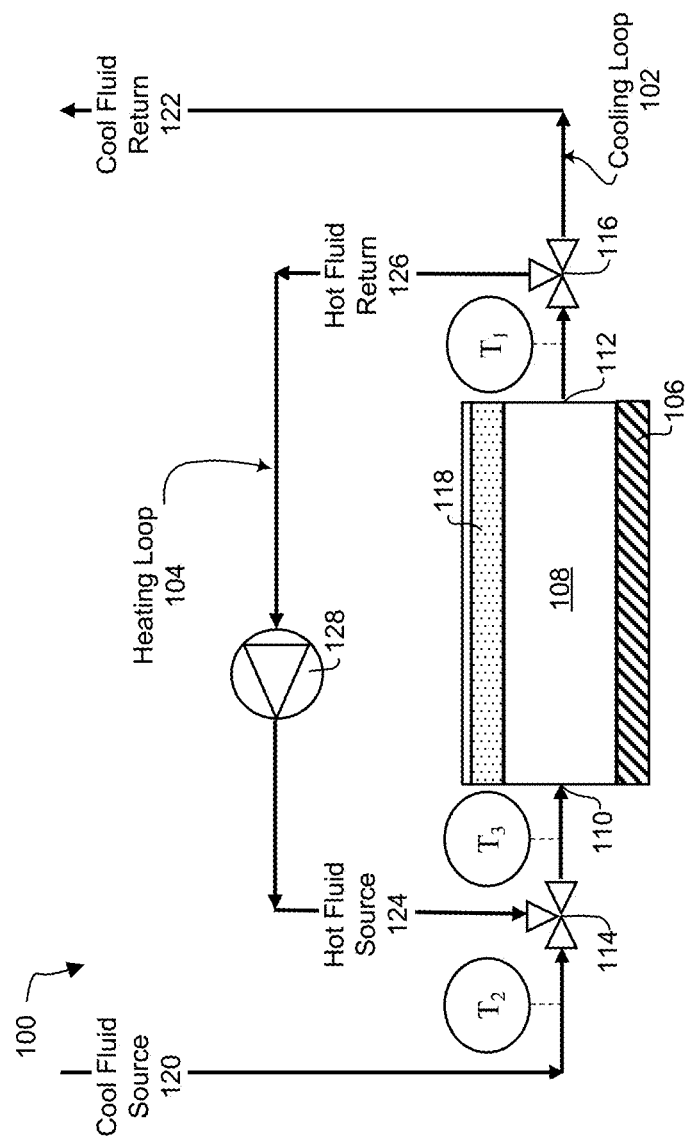
FIGS. 1A-1B are schematics of embodiments of temperature control systems using a temperature control plate for both heating and cooling.

FIG. 1A illustrates an embodiment of a temperature control system 100. System 100 includes a cooling loop 102 and a heating loop 104, both of which are fluidly coupled to a temperature control plate 108 so that they can be used to control the temperature of one more heat-generating electronics components 106. In various modes of operation, cooling loop 102 can operate alone, heating loop 104 can operate alone, or cooling loop 102 and heating loop 104 can operate simultaneously to control the temperature of electronic components 106 by heating, cooling, or a combination of the two.

Temperature control plate 108 is thermally coupled to electronic components 106, so that heat can be exchanged between the electronic components and a working fluid flowing through the temperature control plate. The heat exchange can be in either direction—from electronic components 106 into the working fluid, or from the working fluid into the electronic components—depending on whether system 100 is cooling or heating electronic components 106. Temperature control plate 108 includes a fluid inlet 110 and a fluid outlet 112. An inlet control 114 is fluidly coupled to fluid inlet 110 and an outlet control 116 is fluidly coupled to outlet 112. As used herein, two elements are "fluidly coupled" if they are coupled to each other, directly or indirectly, in such a way that a fluid can flow between them in one or both directions. In the illustrated embodiment inlet control 114 and outlet control 116 are both three-way valves, but in other embodiments they can be other types of controls. For instance, in other embodiments inlet control 114 and outlet control 116 can be combinations of two-way valves. In still other embodiments, inlet control 114 and outlet control 116 need not be the same kind of control. In most operating conditions, inlet control 114 and outlet control 116 will be in the same operating status.

And still further embodiments can omit one of the two controls 114 and 116.

Cooling loop 102 is an open loop fluidly coupled to temperature control plate 108. A cool fluid source 120 is fluidly coupled to inlet control 114 and a cool fluid return 122 is fluidly coupled to outlet control 116, so that the inlet and outlet controls regulate the flow of working fluid from the cooling loop through temperature control plate 108.

Heating loop 104 is similarly coupled to temperature control plate 108 through inlet control 114 and outlet control 116, so that the inlet and outlet controls also regulate the flow of working fluid from the heating loop through temperature control plate 108. A hot fluid source 124 is fluidly coupled to inlet control 114 and a hot fluid return 126 is fluidly coupled to outlet control 116. A pump 128 is fluidly coupled into heating loop 104 to circulate the working fluid through this loop. Temperature control plate 108 includes a heater 118 to heat working fluid flowing through the temperature control plate. Heating loop 104, then, uses heater 118, as well as heat generated by electronic components 106 themselves, to heat the working fluid flowing through the heating loop. By selectively configuring inlet control 114 and outlet control 116, cool working fluid, hot working fluid, or a mixture of the two, can be directed through temperature control plate 108. Heating loop 104 and cooling loop 102 are therefore not completely separate, but rather are fluidly coupled to each other via inlet control 114, outlet control 116, and temperature control plate 108. Put differently, in system 100 temperature control plate 108 is part of both the heating loop and the cooling loop. As a result of their shared coupling to temperature control plate 108, the cooling loop and heating loop circulate the same working fluid.

Heating loop 104 is substantially shorter than cooling loop 102 so that it can quickly heat the fluid contained in its loop and electronic components 106 when needed. Designing the heating loop as a short bypass loop allows working fluid in the loop to heat quickly, since the heat that can be generated and introduced to the loop is limited to a certain period of time. By using heat generated by electronics 106 as much as possible, the working fluid in the loop can also be heated much more quickly. Since the heating loop is a much shorter loop compared to a cooling loop, there is less working fluid in the loop and the fluid within the heating loop can be heated up faster given the limited amount of heat provided.

Temperature sensors can be positioned in various places in system 100 to allow the system's performance to be monitored. The illustrated embodiment includes three temperature sensors T1-T3:

T1 is positioned downstream of outlet 112 to measure the temperature of working fluid exiting temperature control plate 108. In the illustrated embodiment sensor T1 is positioned between outlet 112 and outlet control 116, but in other embodiments T1 could be positioned differently, for instance downstream of outlet control 116 in cool fluid return 122 or hot fluid return 126.

T2 is positioned in cool fluid source 120 upstream of inlet control 114 to measure the temperature of the cool working fluid.

T3 is positioned just upstream of inlet 110 to measure the temperature of working fluid entering temperature control plate 108.

Other embodiments of system 100 can have more or less temperature sensors than shown. When heating loop 104 is not operating, or if inlet control 114 and outlet control 116 are set to stop flow through heating loop 104, then temperatures T2 and T3 will be the same or close to the same. But when heating loop 104 is operating exclusively (i.e., inlet control 114 and outlet control 116 are set to only allow flow from heating loop 104 into temperature control plate 108), or when cooling loop 102 and heating loop 104 are operating simultaneously (i.e., inlet control 114 and outlet control 116 are set to allow flow from both cooling loop 102 and heating loop 104 into temperature control plate 108), T3 will generally be greater than T2.

In operation, system 100 can operate in at least three modes: cooling mode, heating mode, and mixed mode.

Mode 1: cooling mode, cooling loop is recirculating for cooling;

Mode 2: heating mode, only heating loop is recirculating for heating, the heat can be from either heater 118, electronic components 106 or both;

Mode 3: mixed mode this is a transition mode, in mixing mode, the purpose is to use the heat generated in the heating loop to heat up the cooling loop, the heat source is mainly from 106. The design aims to save power, so heater 118 is turned off during transition mode. Another purpose is to eliminate the impact of cooling fluid at relative low temperatures supplied directly to temperature control plate 108.

Cooling mode can be implemented by the cooling loop operating alone, or by the cooling loop and heating loop operating together but with heater 118 turned off. Heating mode is invoked, for instance, in situations where electronics 106 must be started in very cold conditions. In heating mode, the inlet and outlet controls are set to form a closed heating loop, meaning that no working fluid circulates in cooling loop 102. Once the fluid in the heating loop is heated to certain temperature, the inlet and outlet controls can be adjusted to mixed mode, where it mixes working fluid from heating loop and cooling loop. In this mode, the system is operated to ensure proper thermal conditions of the electronic components as well as to adjust to an optimal operating condition. When both loops are working, the system can be adjusted and controlled to an optimal heat transfer equilibrium of the system. Whether in heating mode or mixed mode, heating can be implemented various ways. The working fluid can be heated by electronic components 106 only, by heater 118 only, or by a combination of electronic components 106 and heater 118.

Figure 1B:
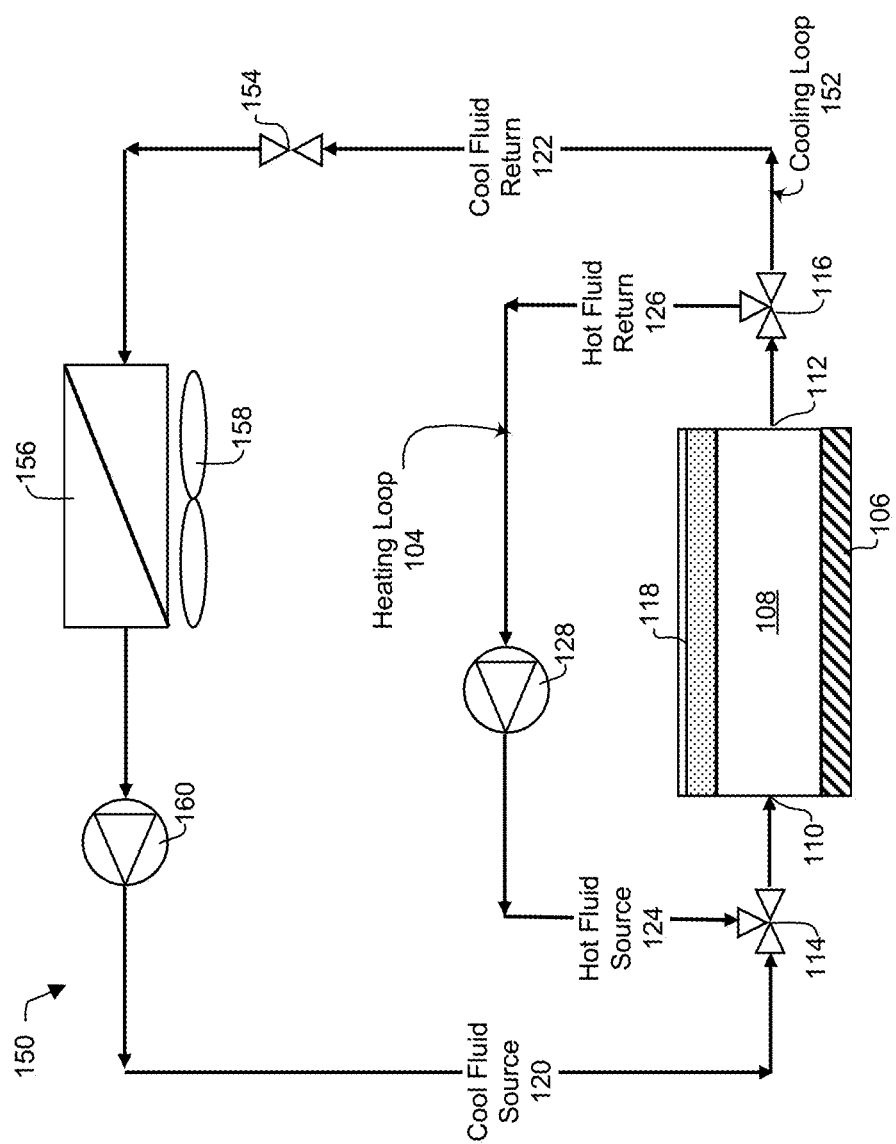

FIG. 1B illustrates an embodiment of a temperature control system 150. System 150 is in most respects similar to system 100: the primary difference between systems 150 and 100 is in the cooling loop, which is an open loop in system 100 but a closed loop in system 150.

System 150 includes a temperature control plate 108 thermally coupled to heat-generating electronics 106. Temperature control plate 108 includes a fluid inlet 110 and a fluid outlet 112, with an inlet control 114 fluidly coupled to fluid inlet 110 and an outlet control 116 fluidly coupled to outlet 112. Temperature control plate 108 allows heat provided by the heat-generating electronic components 106 themselves to heat the working fluid flowing through it, but also includes heater 118 to heat the working fluid.

Heating loop 104 is substantially the same in system 150 as it is in system 100: it is a closed loop fluidly coupled to temperature control plate 108, with hot fluid source 124 fluidly coupled to inlet control 114 and hot fluid return 126 fluidly coupled to outlet control 116, so that the inlet and outlet controls regulate the flow of hot working fluid through temperature control plate 108.

Cooling loop 152 in system 150 is different than cooling loop 102 in system 100. In system 150 the cooling loop is a closed loop instead of an open loop, so that cooling loop 152 includes additional components not found in cooling loop 102. As in system 100, cool fluid source 120 is coupled to inlet control 114 and cool fluid return 122 is coupled to outlet control 116. Cool fluid return 122 is coupled to a valve 154 and to the inlet of a heat exchanger 156. In one embodiment heat exchanger 156 can be an air-cooled radiator with or without a fan 158 to force convection through the radiator, but in other embodiments it can be another type of heat exchanger. A pump 160 is coupled to the cooling loop at the outlet of heat exchanger 156 to circulate working fluid through the cooling loop. Although not shown in the figure (but see FIG. 1A), system 150 can include the same temperature sensors T1-T3 in the same locations as in system 100.

Despite their differences, system 150 and 100 operate similarly and have the same modes of operation. By selectively configuring inlet control 114 and outlet control 116, cool working fluid, hot working fluid, or a mixture of the two, can be directed through temperature control plate 108 to regulate the temperature of electronics 106.

Figure 2A:
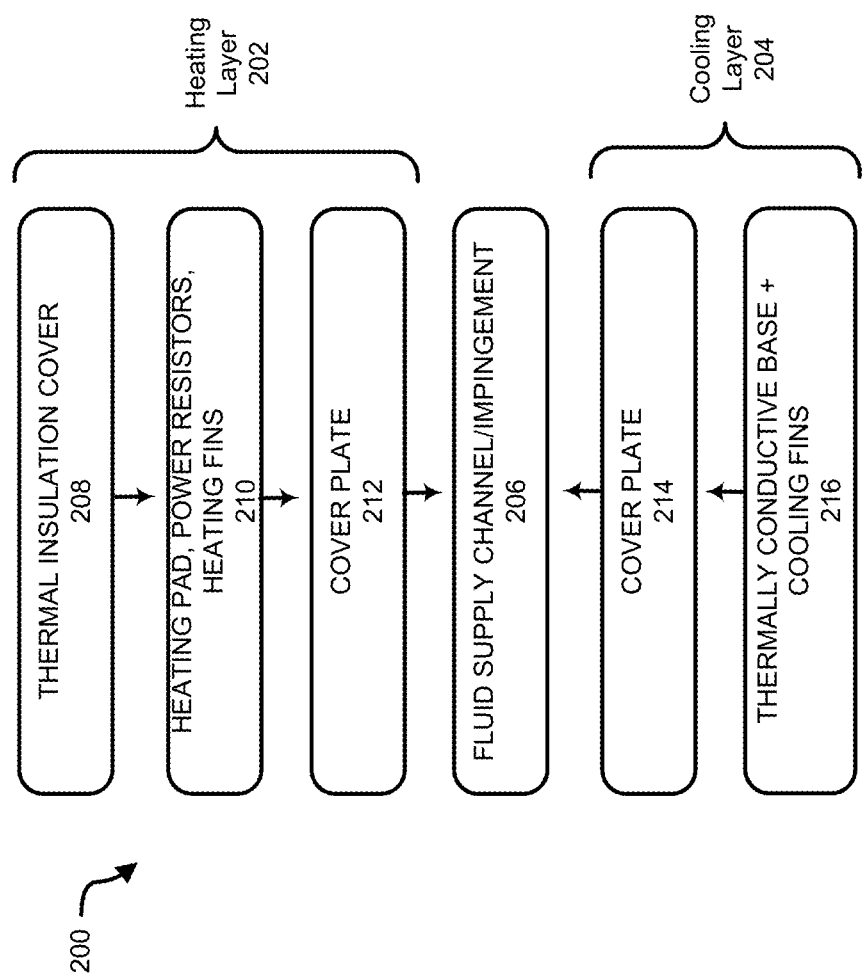

FIG. 2A conceptually illustrates the components and assembly of a thermal control plate 200 that can be used in embodiment of system 100 and 150. The figure can be used as a design guideline, but the layers, their position, and the grouping or components within each layer, can be modified as needed in an actual application. In addition, some of the layers can be combined and additional layers, such as ones for providing additional fluid channels, can be added.

Thermal control plate 200 includes a heating layer 202 and a cooling layer 204, each of which can include multiple components or sublayers. A fluid supply/impingement layer 206 coupled to both the heating layer and the cooling layer. As uses herein, "heating" and "cooling" refer to whether thermal control plate 200 heats or cools heat-generating electronics to which it is coupled (see, e.g., FIGS. 1A-1B and 2B). Similarly, within a thermal control plate the terms "heating" and "cooling," when applied to layers or their components, are used to describe each layer or component's nominal function and to distinguish them from each other. But the terms are not limiting: in some modes of operation, the heating layer or heating components can cool or the cooling layer or components can heat (see, e.g., FIGS. 5A-5B).

Figure 3A:
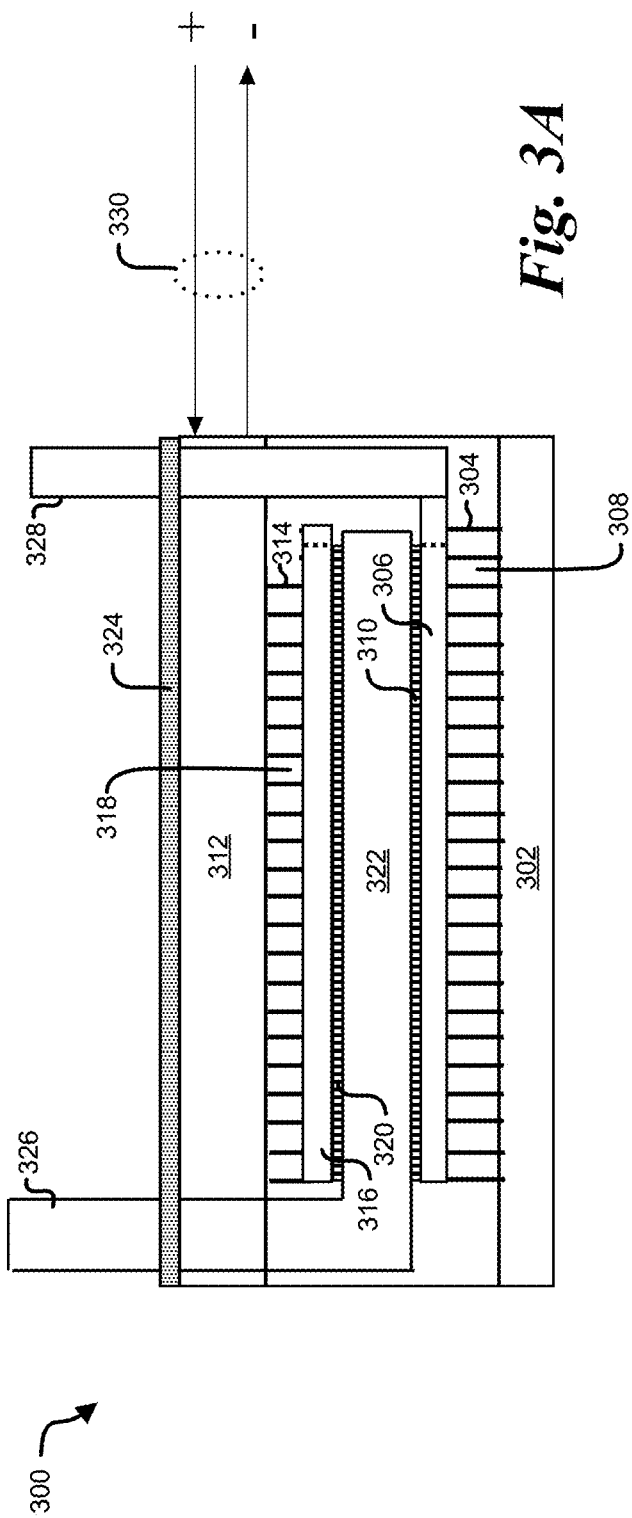
FIG. 3A is a cross-sectional view of an embodiment of a temperature control plate for both heating and cooling.
Figure 3B:
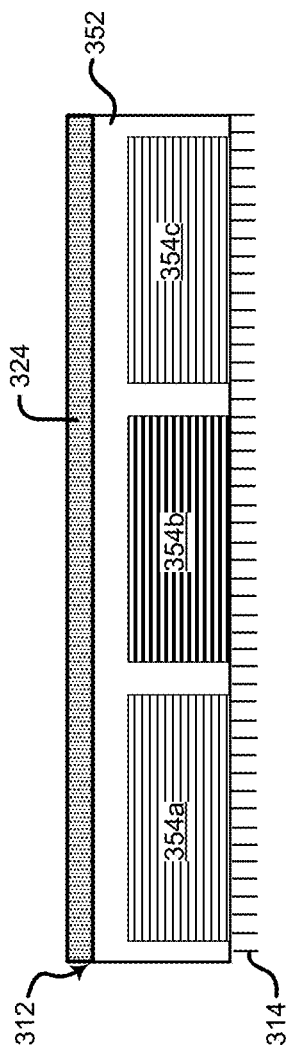
FIG. 3B is a cross-sectional view of an embodiment of a heater that can be used in the temperature control plate of FIG. 3A.

Heating layer 202 includes a heater 210, which in various embodiments can include a heating pad with electrical power resistors to generate heat (see, e.g., FIG. 3B). Heater 210 can be thermally coupled to heating fins or some other mechanism for transferring heat to a working fluid. A cover plate 212 is attached to heater 210 to form heating channels through which the working fluid can flow. Cooling layer 204 includes a thermally conductive base 216 that can be thermally coupled to heat-generating electronic components to cool or heat the electronic components. Cooling fins can be thermally coupled to the thermally conductive base to transfer heat from the electronic components to the working fluid (in cooling mode) or to transfer heat from the working fluid to the electronic components (in heating mode). A cover plate 214 is attached to base 216 to form cooling channels through which the working fluid can flow. Finally, a fluid supply/impingement channel 206 is fluidly coupled to both heating layer 202 and cooling layer 204 to supply these layers with a working fluid.

FIG. 2B illustrates an embodiment of the main components of a thermal control plate 250 arranged substantially according to the layout shown in FIG. 2A. Thermal control plate 250 includes thermally conductive base 254 that is thermally coupled to heat-generating electronic components 252, and a heater 256 with an optional insulating layer 264. Heater 256 and thermally conductive base 254 form the upper and lower boundaries of a fluid flow area 262. The remaining components mentioned in FIG. 2A—cover plates, heating and cooling channels, and the fluid supply/impingement channel—are positioned in fluid flow area 262. A fluid inlet 258 and a fluid outlet 260 are fluidly coupled to fluid flow area 262 or the components within that area. The configuration of the components within fluid flow area 262 can vary in different embodiment; a particular embodiment is shown in FIG. 3A and described below.

FIG. 3A illustrates an embodiment of a compact thermal control plate 300. Thermal control plate 300 includes a cooling layer and a heating layer. The cooling layer includes thermally conductive base 302, which is adapted to be thermally coupled to heat-generating electronic components (see FIGS. 1A-1B and 2B). Thermally conductive base 302 is thermally coupled to a plurality of cooling fins 304, and the ends of each of the plurality of cooling fins 304 is in turn attached to a cooling cover plate 306. Attaching cover plate 306 to the ends of the plurality of cooling fins 304 forms a plurality of cooling channels 308 through which working fluid can flow, with each cooling channel bounded by base 302, cover plate 306, and a pair of cooling fins 304.

The heating layer in thermal control plate 300 includes heater 312. Heater 312 is in turn thermally coupled to a plurality of heating fins 314, and the end of each of the plurality of heating fins 314 is in turn attached to a heating cover plate 316. Attaching heating cover plate 316 to the ends of the plurality of heating fins 314 forms a plurality of heating channels 318 through which working fluid can flow, with each heating channel 318 bounded by heater 312, heating cover plate 316, and a pair of heating fins 314. An insulating layer 324 can be placed on an exterior side of heater 312 to further the flow of heat from the heater to the exterior. Electrical connections 330 are coupled to heater 312 to supply electrical power to power resistors therein (see FIG. 3B). In one embodiment direct current (DC) power is supplied to the heater, but other embodiments can differ.

A fluid supply channel 322 is sandwiched between the cooling layer and the heating layer so that it can supply working fluid to both layers. In the illustrated embodiment fluid supply channel 322 is sandwiched between cooling cover plate 306 and heating cover plate 316, but in other embodiments the fluid supply channel can be positioned differently than shown. An inlet 326 is fluidly coupled to fluid supply channel 322 to supply it with working fluid, and an outlet 328 is fluidly coupled to cooling channels 308 and heating channels 318 to allow the working fluid to exit from the thermal control plate. The fluid inlet and outlet ports are used to connect to fluid hoses or piping to connect the device into the loop or system. Fluid supply channel 322 has perforations through which working fluid exist the channel and enters into cooling channels 308 and heating channels

318. In some embodiments the working fluid can be at ambient pressure, but in other embodiments it can be pressurized, meaning that it is at higher than ambient pressure. In different embodiments the perforations can have different shapes—for instance, the perforations can be openings or notches with a substantially rounded rectangular shape.

An impingement plate 310 is positioned between fluid supply channel 322 and cooling cover plate 306, and another impingement plate 320 is positioned between fluid supply channel 322 and heating cover plate 316. Fluid exiting from fluid supply channel 308 travels through or around the impingement plates to enter cooling channels 308 and heating channels 318. This impingement supply structure can be embedded on the channel. The fluid flows over the entire fin area (both cooling and heating ones) before it leaves the fin area and finds a way to the outlet ports. In one embodiment impingement plates 310 and 320 can be perforated, with the perforations of the impingement plates substantially aligned with the perforations in fluid supply channel 322. In different embodiments the perforations can have different shapes—for instance, the perforations can be openings or notches with a substantially rounded rectangular shape.

FIG. 3B illustrates an embodiment of a heater 312 that can be used in temperature control plate 300. Heater 312 includes a thermally insulating base 352 within which are positioned one or more power resistors 354. The illustrated embodiment has three power resistors 354a-354c uniformly distributed within base 352, but in other embodiments there can be more or less power resistors than shown, the power resistors need not be uniformly distributed, and the power resistors need not all be of the same type. In one embodiment power resistors 354 can be ceramic power resistors, but the number and nature of the power resistors will generally depend on the desired heating rate. Electrical connections 330 (see FIG. 3A) are provided so that electric power can be delivered to power resistors 354. An insulating cover 324 can optionally be coupled to the exterior side of thermally insulating base 352 if further thermal insulation is needed to slow or prevent heat transfer from base 352 to the exterior. Heat fins 314 project from the interior side of base 352 and are thermally coupled to power resistors 354a-354c so that heat generated by the power resistors can flow into fins 314 by conduction. In addition to heating, heater 312 provides some additional functions: it covers the power resistors to separate them from the working fluid; it extends heat transfer area by adding fins for better performance; and it adds high thermal resistance on the top for thermal insulation.

Figure 4A:
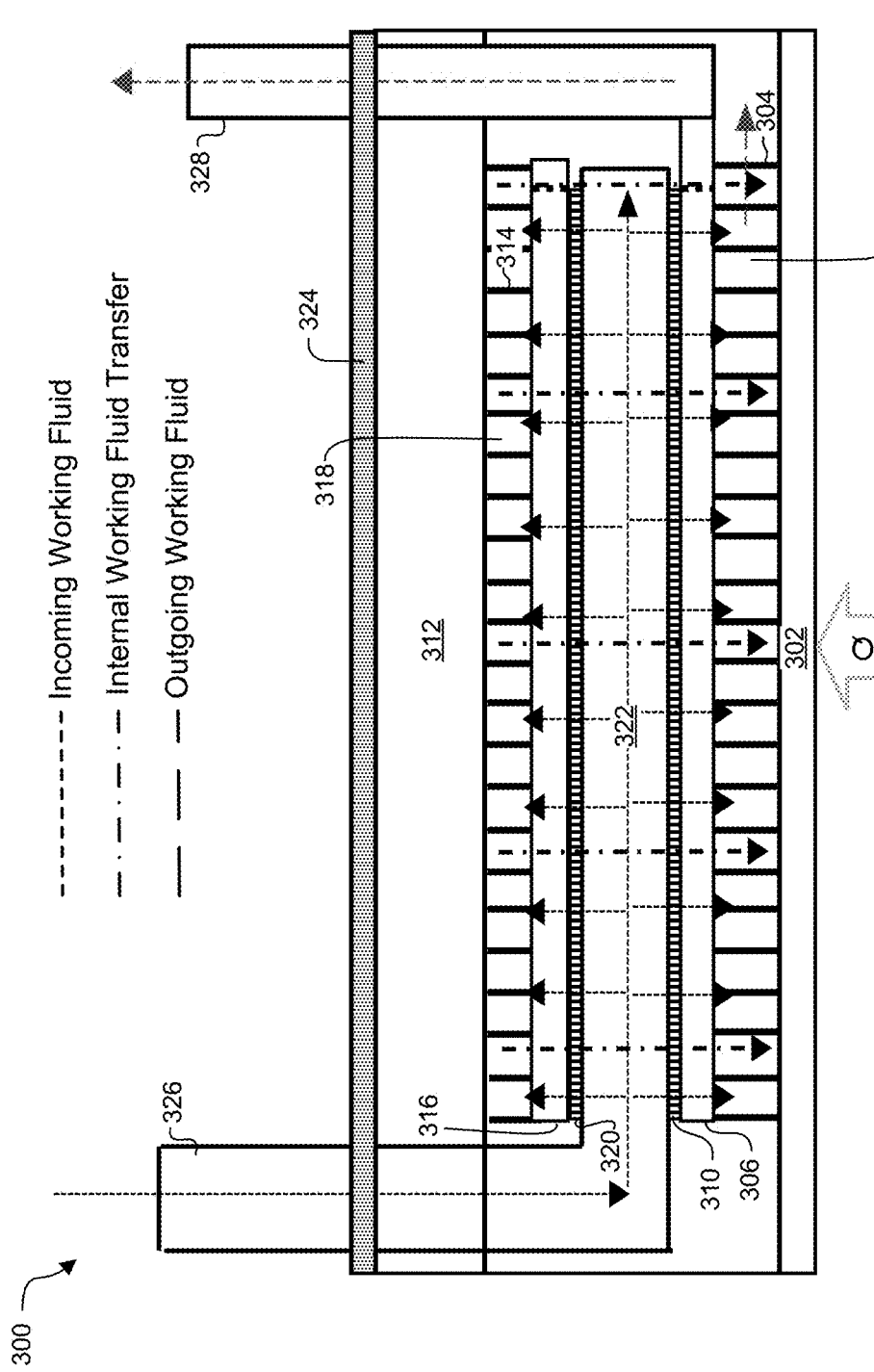
FIGS. 4A-4B are cross-sectional views of an embodiment of the temperature control plate of FIG. 3A during cooling (FIG. 5A) and heating (FIG. 5B).
Figure 4B:
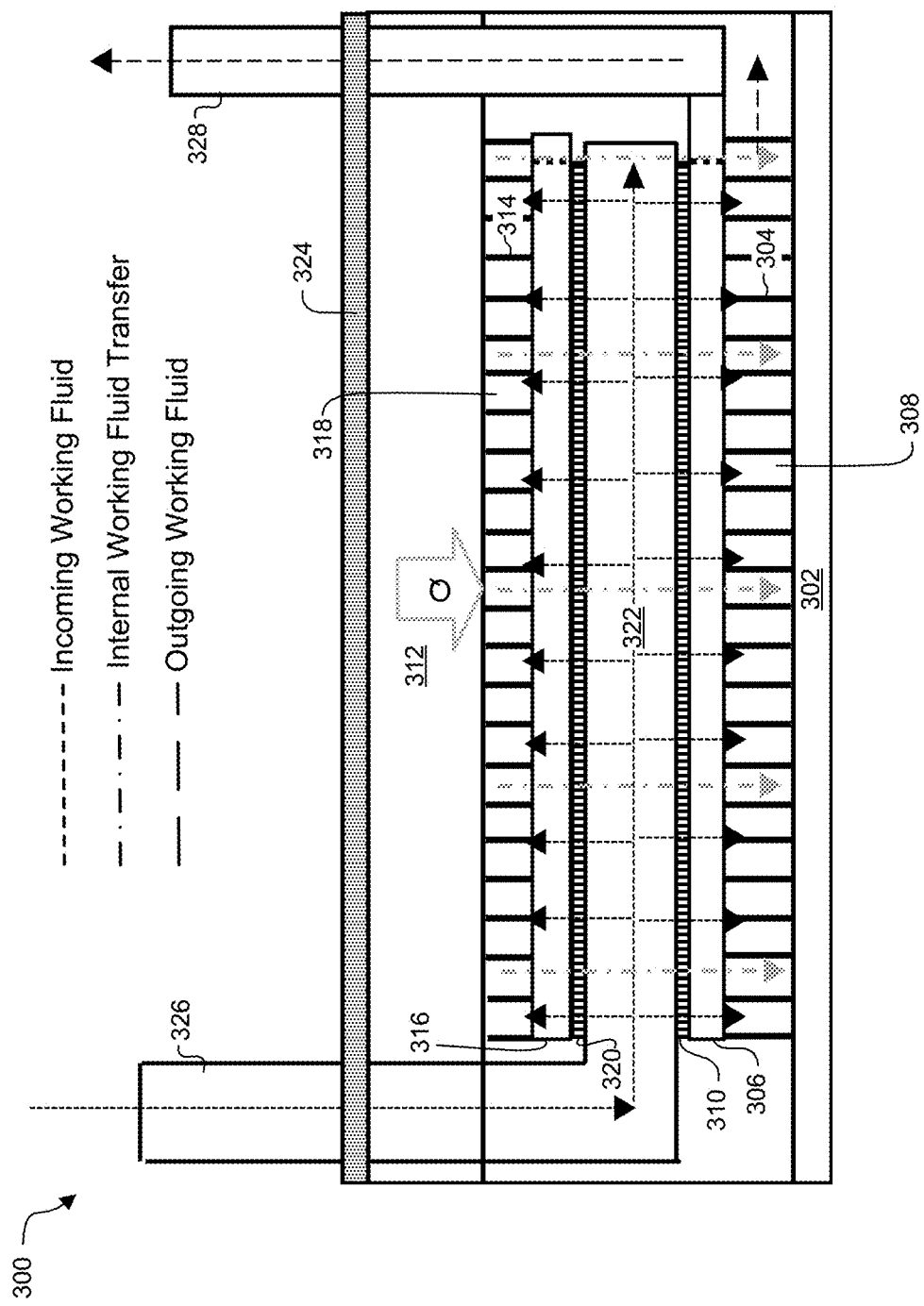

FIGS. 4A-4B illustrate embodiments of operation of thermal control plate 300 in a cooling mode and a heating mode. FIG. 4A illustrates the cooling mode—i.e., when thermal control plate 300 is used to cool electronic components coupled to the thermal control plate (see, e.g., FIGS. 1A-1B). During cooling, heater 312 is switched off and thermally conductive base 302 receives a heat input Q, as shown in the figure, from heat-generating electronics to which base 302 is thermally coupled. The working fluid enters thermal control plate 300 through inlet 326 and proceeds to fluid supply channel 322. From supply channel 322, the working fluid is distributed through impingement plate 310 and cooling cover plate 306 into cooling channels 308, and is simultaneously distributed through impingement plate 320 and heating cover plate 316 into heating channels 318. Heat input Q is transferred by conduction through thermally conductive base 302 and into cooling fins 304. Together, thermally conductive base 302 and fins 304 heat the working fluid flowing through cooling channels 308. At the same time, working fluid flowing through heating channels 318—which is not being heated because heater 312 is turned off in cooling mode—is transferred internally to cooling channels 308, where it also absorbs heat from base 302 and fins 304. In other words, all the working fluid is being used for cooling. The working fluid then flows out of cooling channels 308 and exits the thermal control plate through outlet 328.

FIG. 4B illustrates the operation of thermal control plate 300 in a heating mode—i.e., when thermal control plate is used to heat electronic components to which base 302 is thermally coupled (see FIGS. 1A-1B). This might be, for instance, during winter operation, when the ambient temperature is extremely low, the working fluid and the electronics might need to be heated before they can operate normally. During heating, heater 312 is switched on so that DC voltage is applied to the power resistors. The electricity passing through the power resistors generates a heat input Q into heating fins 314, as shown in the figure. The working fluid enters thermal control plate 300 through inlet 326 and proceeds to fluid supply channel 322. From supply channel 322, the working fluid is distributed through impingement plate 310 and cooling cover plate 306 into cooling channels 308, and is simultaneously distributed through impingement plate 320 and heating cover plate 316 into heating channels 318. Heat input Q is transferred by heater 312 into heating fins 314. Together, heater 312 and heating fins 314 heat the working fluid flowing through heating channels 318. Working fluid simultaneously flows through cooling channels 308, where it is not heated at all if the electronics components are turned off, but is heated by the electronic components if they are turned on. Heated working fluid from heating channels 318 is transferred internally to cooling channels 308, where it transfers heat into the heat-generating components through cooling fins 304 and base 302. The working fluid then flows out of cooling channels 308 and exits the thermal control plate through outlet 328.

Other temperature control plate embodiments are possible besides the ones described above. For instance:
- The layer sequence and arrangement can be different than described while achieving similar results.
- The locations and packaging method can be different.
- The internal fluid structure can be different and optimized for better performance.
- The thermal control plate can be designed in different shapes.
- Different packaging methods can be used for the heating pad layer, depending on the actual power resistor used.

The above description of embodiments is not intended to be exhaustive or to limit the invention to the described forms. Specific embodiments of, and examples for, the invention are described herein for illustrative purposes, but various modifications are possible.

What is claimed is:
1. A thermal control plate comprising:
   a cooling layer including:
   a thermally conductive base adapted to be thermally coupled to one or more heat-generating electronic components,
   a plurality of cooling fins thermally coupled to the thermally conductive base, and
   a cooling cover plate coupled to ends of the plurality of cooling fins so that the thermally conductive base, the cooling cover plate, and the plurality of cooling fins form a plurality of cooling channels through which a working fluid can flow;

a heating layer including:
  a heater,
  a plurality of heating fins thermally coupled to the heater, and
  a heating cover plate coupled to ends of the plurality of heating fins so that the heater, the heating cover plate, and the plurality of heating fins form a plurality of heating channels through which the working fluid can flow; and
a fluid distribution channel fluidly coupled to the heating layer and the cooling layer and disposed between the heating layer and the cooling layer, wherein the fluid distribution channel can distribute the working fluid into the plurality of heating channels and the plurality of cooling channels.

2. The thermal control plate of claim 1 wherein the heater comprises:
a thermally insulating cover; and
one or more electrical resistance heaters positioned in the thermally insulating cover, the electrical resistance heaters being thermally coupled to the plurality of heating fins.

3. The thermal control plate of claim 2 wherein the heater further comprises an electrical connection to provide electrical power to the electrical resistance heaters.

4. The thermal control plate of claim 1 wherein the fluid distribution channel is sandwiched between the heating layer and the cooling layer.

5. The thermal control plate of claim 1 wherein the fluid distribution channel has perforations through which the working fluid travels from the fluid distribution channel into the heating channels and cooling channels.

6. The thermal control plate of claim 5 wherein the heating cover plate of the heating layer and the cooling cover plate of the cooling layer are permeable, so that the fluid distribution channel is fluidly coupled to the heating channels and the cooling channels through their respective cover plates.

7. The thermal control plate of claim 5, further comprising:
a first impingement plate sandwiched between the fluid distribution channel and the heating cover plate of the heating layer; and
a second impingement plate sandwiched between the fluid distribution channel and the cooling cover plate of the cooling layer.

8. The thermal control plate of claim 7 wherein the first and second impingement plates are perforated, the perforations of the fluid distribution channel being substantially aligned with the perforations of the first and second impingement plates.

9. The thermal control plate of claim 1, further comprising a fluid inlet coupled to the fluid distribution channel and a fluid outlet coupled to at least one of the cooling channels.

10. A thermal control system comprising:
a cooling loop to circulate a working fluid, the cooling loop including
a temperature control plate having a fluid inlet and a fluid outlet, the temperature control plate comprising:
  a cooling layer including:
    a thermally conductive base adapted to be thermally coupled to one or more heat-generating electronic components,
    a plurality of cooling fins thermally coupled to the thermally conductive base, and
    a cooling cover plate coupled to ends of the plurality of cooling fins so that the thermally conductive base, the cooling cover plate, and the plurality of cooling fins form a plurality of cooling channels through which a working fluid can flow;
  a heating layer including:
    a heater,
    a plurality of heating fins thermally coupled to the heater, and
    a heating cover plate coupled to ends of the plurality of heating fins so that the heater, the heating cover plate, and the plurality of heating fins form a plurality of heating channels through which the working fluid can flow; and
  a fluid distribution channel fluidly coupled to the heating layer and the cooling layer, and disposed between the heating layer and the cooling layer wherein the fluid distribution channel can distribute the working fluid into the plurality of heating channels and the plurality of cooling channels;
an inlet control fluidly coupled to the fluid inlet of the temperature control plate and an outlet control fluidly coupled to the fluid outlet of the temperature control plate, and
a cooling fluid source fluidly coupled the inlet control and a cooling fluid return fluidly coupled to the outlet control; and
a heating loop to circulate the working fluid, the heating loop being shorter than the cooling loop and including:
a heating fluid source fluidly coupled the inlet control and a heating fluid return fluidly coupled to the outlet control, and
a pump to circulate heating fluid through at least the heating fluid source, the temperature control plate, and the heating fluid return.

11. The thermal control system of claim 10 wherein the heater comprises:
a thermally insulating cover; and
one or more electrical resistance heaters positioned in the thermally insulating cover, the electrical resistance heaters being thermally coupled to the plurality of heating fins.

12. The thermal control system of claim 11 wherein the heater further comprises an electrical connection to provide electrical power to the electrical resistance heaters.

13. The thermal control system of claim 10 wherein the fluid distribution channel is sandwiched between the heating layer and the cooling layer.

14. The thermal control system of claim 10 wherein the fluid distribution channel has perforations through which the working fluid travels from the fluid distribution channel into the heating channels and cooling channels.

15. The thermal control system of claim 14 wherein the heating cover plate of the heating layer and the cooling cover plate of the cooling layer are permeable, so that the fluid distribution channel is fluidly coupled to the heating channels and the cooling channels through their respective cover plates.

16. The thermal control system of claim 14, further comprising:
a first impingement plate sandwiched between the fluid distribution channel and the heating cover plate of the heating layer; and
a second impingement plate sandwiched between the fluid distribution channel and the cooling cover plate of the cooling layer.

17. The thermal control system of claim 16 wherein the first and second impingement plates are perforated, the perforations of the fluid distribution channel being substantially aligned with the perforations of the first and second impingement plates.

18. The thermal control system of claim 10, further comprising a fluid inlet coupled to the fluid distribution channel and a fluid outlet coupled to at least one of the cooling channels.

19. The thermal control system of claim 10 wherein the inlet control, the outlet control, or both, are three-way valves.

20. The thermal control system of claim 10 wherein the cooling loop is a closed loop that further comprises:
- a heat exchanger coupled to the cooling fluid source and the cooling fluid return; and
- a pump coupled in the cooling loop to circulate working fluid through the cooling loop.

\* \* \* \* \*